(12) United States Patent
Song (10) Patent No.: US 7,285,794 B2
(45) Date of Patent: Oct. 23, 2007

(54) QUANTUM SEMICONDUCTOR DEVICE AND METHOD FOR FABRICATING THE SAME

(75) Inventor: Hai-Zhi Song, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/781,684

(22) Filed: Feb. 20, 2004

(65) Prior Publication Data

US 2004/0169195 A1 Sep. 2, 2004

(30) Foreign Application Priority Data

Feb. 27, 2003 (JP) ............................. 2003-051177

(51) Int. Cl.
*H01L 31/0328* (2006.01)

(52) U.S. Cl. ........................................ 257/14; 257/194

(58) Field of Classification Search .................. 257/14, 257/17, 20, 24, 27

See application file for complete search history.

(56) References Cited

U.S. PATENT DOCUMENTS

| 5,192,709 | A | * | 3/1993 | Petroff | ........................ 438/508 |
| 5,408,106 | A | * | 4/1995 | Seabaugh | ..................... 257/17 |
| 5,559,343 | A | * | 9/1996 | Kiehl | ........................... 257/14 |
| 5,701,017 | A | * | 12/1997 | Patel et al. | .................... 257/27 |
| 6,335,245 | B2 | | 1/2002 | Park et al. | |

(Continued)

FOREIGN PATENT DOCUMENTS

JP 5-211342 8/1993

(Continued)

OTHER PUBLICATIONS

U.F. Keyser et al.; "Fabrication of a single-electron transistor by current-controlled local oxidation of a two-dimensional electron system"; *Applied Physics Letters*; vol. 76; No. 4; Jan. 24, 2000; pp. 457-459.

(Continued)

*Primary Examiner*—Thomas L. Dickey
(74) *Attorney, Agent, or Firm*—Kratz, Quintos & Hanson, LLP.

(57) ABSTRACT

The quantum semiconductor device comprises a first semiconductor layer 18 on a substrate 10 with a two-dimensional carrier gas formed in; a quantum dot 20 formed on the first semiconductor layer 18; a second semiconductor layer 22 formed on the first semiconductor layer 18, covering the quantum dot 20; a dot-shaped structure 24 formed on the surface of the second semiconductor layer 22 at the position above the quantum dot 20; and an oxide layer 26a, 26b formed on the surface of the second semiconductor layer 22 on both sides of the dot-shaped structure 24. The crystal strains generated in the surface of the semiconductor layer 22 due to the presence of the quantum dot 20 causes the dot-shaped structure 24 to grow on the semiconductor layer 22 surface at the position which is accurately above the quantum dot 20. This permits the oxide layer 26a, 26b to be formed with the dot-shaped structure 24 as a mark, and the source/drain regions 30a, 30b can be formed with the oxide layer 26a, 26b as a mark. Thus, even in a case that the self-assembled fine quantum dot 20 is buried in the semiconductor layer 22, the quantum semiconductor device can be formed without failure.

12 Claims, 11 Drawing Sheets

U.S. PATENT DOCUMENTS 6,498,360 B1 * 12/2002 Jain et al. .................. 257/194
6,720,589 B1 * 4/2004 Shields ....................... 257/194

FOREIGN PATENT DOCUMENTS

| JP | 6-196720 | 7/1994 |
|----|----------|--------|
| JP | 10-303408 | 11/1998 |
| JP | 11-150261 | 6/1999 |
| JP | 2000-91451 | 3/2000 |
| JP | 2001-7315 | 1/2001 |
| JP | 2002-518851 | 6/2002 |

OTHER PUBLICATIONS

T. Fujisawa et al. "Transient current spectroscopy of a quantum dot in the Coulomb blockade regime"; *Physical Review B*; vol. 63; 081304(R); 2001; 4 pages.

Abstract of WO 99/66562 published Dec. 23, 1999/Corresponds to Japanese document No. 2002-518851.

* cited by examiner

QUANTUM SEMICONDUCTOR DEVICE AND METHOD FOR FABRICATING THE SAME

CROSS-REFERENCE TO RELATED APPLICATION

This application is based upon and claims priority of Japanese Patent Application No. 2003-51177, filed on Feb. 27, 2003, the contents being incorporated herein by reference.

BACKGROUND OF THE INVENTION

The present invention relates to a quantum dot semiconductor device and a method for fabricating the quantum semiconductor device, more specifically a quantum semiconductor device having a quantum dot and a method for fabricating the quantum semiconductor device.

Recently, semiconductor devices, such as MOS transistors, etc., are rapidly increasingly micronized.

The micronization of semiconductor devices, such as MOS transistors, etc., is limited. In MOS transistors, for example, when the gate length is too short, the normal switching is impossible.

Then, as a device which can realize further micronization, single electron devices are proposed. Single electron devices have small power consumption and are much noted in terms of decreasing the power consumption.

For example, Patent Reference 1 proposes a single electron transistor comprising a first gate electrode which is formed on a semiconductor of a two-dimensional electron structure and which is divided in a plurality of parts, and a second gate electrode in a region enclosed by the first gate electrode with an insulation film formed there between. In such single electron transistor, an electron confined region is formed due to a depletion layer generated by applying a voltage to the first gate electrode. By applying a voltage to the second electrode, the single electron transition can be controlled.

Patent Reference 2 proposes a single electron transistor comprising quantum wires.

Patent Reference 3 proposes a single electron transistor comprising quantum boxes formed in concavities formed in a semiconductor surfaces.

However, in the proposed single electron devices described above, electrons are confined in relatively large region, which makes it impossible to obtain discrete energy levels, and what are obtained are only classic effects, such as Coulomb blockade. Furthermore, the Coulomb blockade cannot be produced without setting the temperature to be sufficiently low.

To produce Coulomb blockade at relative high temperatures it is necessary to form fine quantum dots. In the fine quantum dots, discrete energy levels can be obtained, which permits Coulomb blockade to take place at relatively high temperatures. To produce Coulomb blockade at the room temperature, for example, the size of the quantum dots must be below about 10 nm.

Patent Reference 4 proposes a single electron device comprising fine quantum dots formed in the side wall of a step formed in a substrate, and a gate electrode formed, covering the quantum dots. In Patent Reference 4, fine quantum dots are used, which permits the device to operate at relatively high temperatures.

Following references disclose the background art of the present invention.

[Patent Reference 1]
Specification of Japanese Patent Application Unexamined Publication No. Hei 6-196720
[Patent Reference 2]
Specification of Japanese Patent Application Unexamined Publication No. 2002-518851
[Patent Reference 3]
Specification of Japanese Patent Application Unexamined Publication No. Hei 10-303408
[Patent Reference 4]
Specification of Japanese Patent Application Unexamined Publication No. Hei 11-150261
[Patent Reference 5]
Specification of Japanese Patent Application Unexamined Publication No. Hei 5-211342
[Patent Reference 6]
Specification of Japanese Patent Application Unexamined Publication No. 2000-91451
[Patent Reference 7]
Specification of Japanese Patent Application Unexamined Publication No. 2001-7315
[Non-Patent Reference 1]
Keyser et al., Appl. Phys. Lett. 76, 457 (2000)
[Non-Patent Reference 2]
T. Fujisawa et al., Phys. Rev. B63, 081304R.(2001)

However, the single electron device proposed in Patent Reference 4 has too complicated operation to be practically applied.

SUMMARY OF THE INVENTION

An object of the present invention is to provide a useful quantum semiconductor device using fine quantum dots and a method for fabricating the quantum semiconductor device.

According to one aspect of the present invention, there is provided a quantum semiconductor device comprising: a first semiconductor layer formed on a substrate and having a two-dimensional carrier gas formed in; a quantum dot formed on the first semiconductor layer; a second semiconductor layer formed on the first semiconductor layer, covering the quantum dot; a dot-shaped structure formed on the surface of the second semiconductor layer at a position above the quantum dot; and an oxide layer formed on two sides of the dot-shaped structure on the surface of the second semiconductor layer.

According to another aspect of the present invention, there is provided a method for fabricating a quantum semiconductor device comprising the steps of: forming on a substrate a first semiconductor layer with a two-dimensional carrier gas formed in; forming a quantum dot on the first semiconductor layer; forming a second semiconductor layer, covering the quantum dot; forming a dot-shaped structure on the surface of the second semiconductor at a position above the quantum dot due to strains generated in the surface of the second semiconductor layer due to the presence of the quantum dot; and forming an oxide layer on the surface of the second semiconductor layer on both side of the dot-shaped structure with the dot-shaped structure as a mark.

According to the present invention, the crystal strains generated in the surface of the semiconductor layer due to the presence of the quantum dot causes the dot-shaped structure to grow on the semiconductor layer surface at the position which is accurately above the quantum dot. This permits the oxide layer to be formed with the dot-shaped structure as a mark, and the source/drain regions can be formed with the oxide layer as a mark. Thus, according to the present invention, even in a case that the self-assembled fine quantum dot is buried in the semiconductor layer, the quantum semiconductor device can be formed without failure.

According to the present invention, the self-assembled fine quantum dot is used, whereby discrete energy levels can be provided in the quantum dot. Thus, according to the present invention, the quantum semiconductor device which is operative at relative high temperatures can be provided.

DETAILED DESCRIPTION OF THE INVENTION

Figure 1:
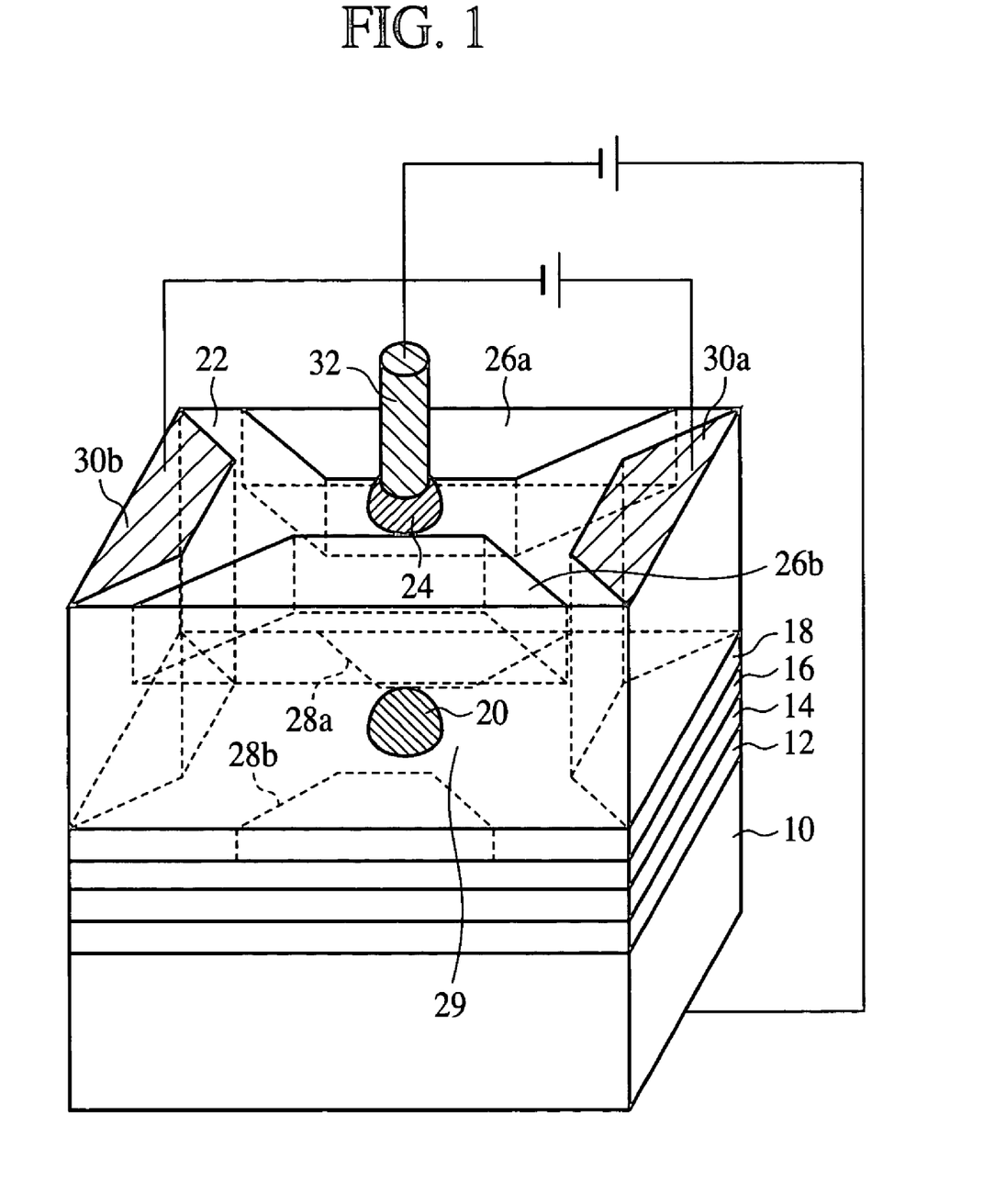
FIG. 1 is a perspective view of the quantum semiconductor device according to one embodiment of the present invention.
Figure 2A:
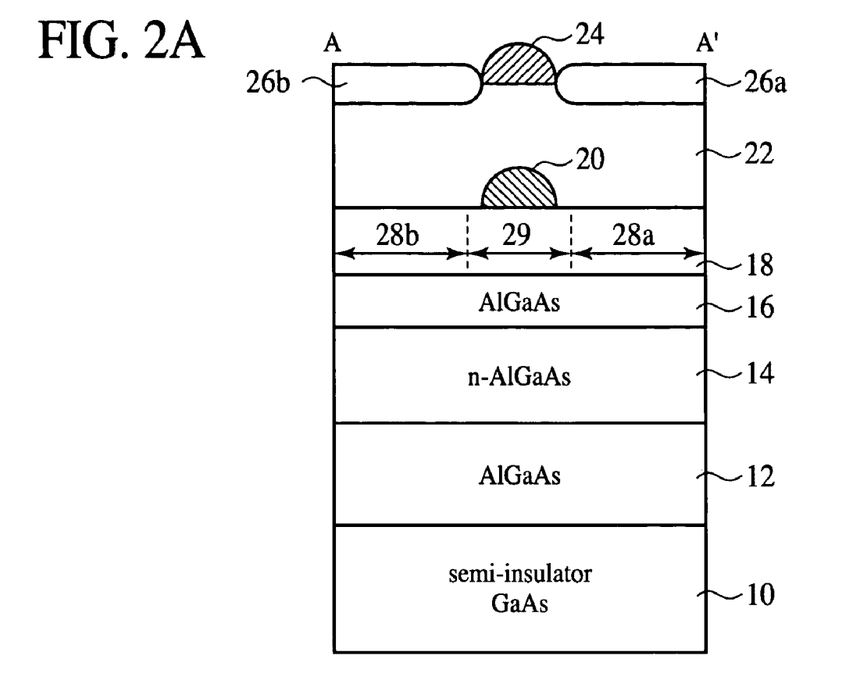
FIG. 2A is a sectional view of the quantum semiconductor device according to the embodiment of the present invention.
Figure 2B:
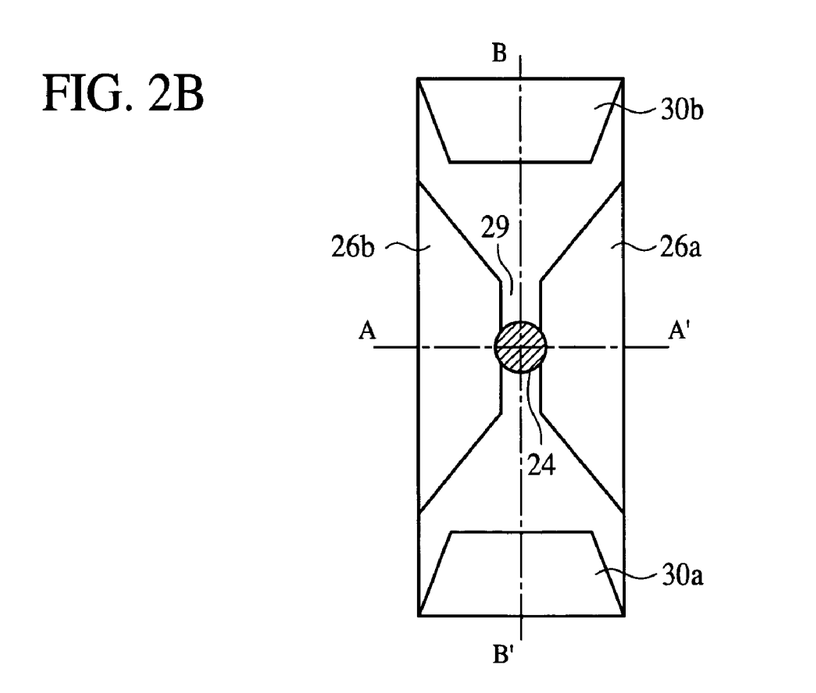
FIG. 2B is a plan view of the quantum semiconductor device according to the embodiment of the present invention.

The quantum semiconductor device according to one embodiment of the present invention and the method for fabricating the quantum semiconductor device will be explained with reference to FIGS. 1 to 8B. FIG. 1 is a perspective view of the quantum semiconductor device according to the present embodiment. FIG. 2A is a sectional view of the quantum semiconductor device according to the present embodiment. FIG. 2B is a plan view of the quantum semiconductor device according to the present embodiment. FIG. 2A is the sectional view along the line A-A' in FIG. 2B.

(The Quantum Semiconductor Device)

The quantum semiconductor device according to the present embodiment will be explained with reference to FIGS. 1 to 2B.

As shown in FIGS. 1 to 2B, a non-doped AlGaAs layer 12 is formed on a substrate 10. The substrate 10 is a semi-insulating substrate of, e.g., GaAs. The AlGaAs layer 12 functions as a buffer layer. The thickness of the AlGaAs layer 12 is, e.g., about 200 nm.

An n-type AlGaAs layer 14 is formed on the AlGaAs layer 12. The thickness of the n-type AlGaAs layer 14 is, e.g., 10-20 nm.

A non-doped AlGaAs layer 16 is formed on the n-type AlGaAs layer 14. The AlGaAs layer 16 functions as a spacer layer. The thickness of the AlGaAs layer 16 is, e.g., about 5-10 nm.

A semiconductor layer, specifically anon-doped GaAs layer 18 is formed on the AlGaAs layer 16. The thickness of the GaAs layer 18 is, e.g., about 5 nm.

Figure 5A:
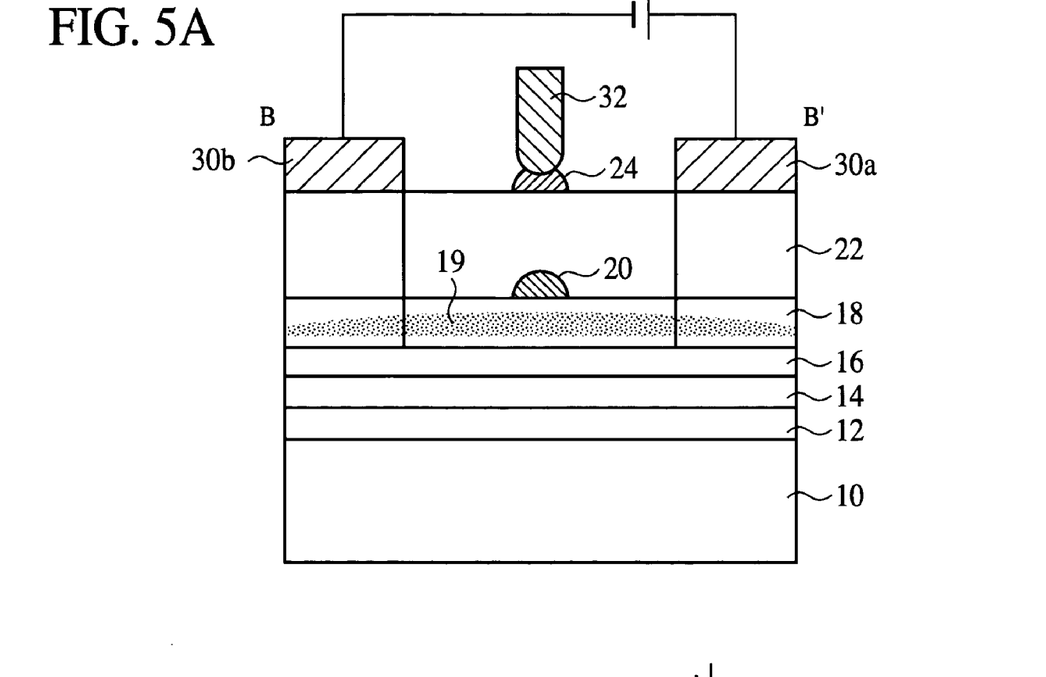
FIGS. 5A and 5B are conceptual views of the operation of the quantum semiconductor device according to the embodiment of the present invention.
Figure 5B:
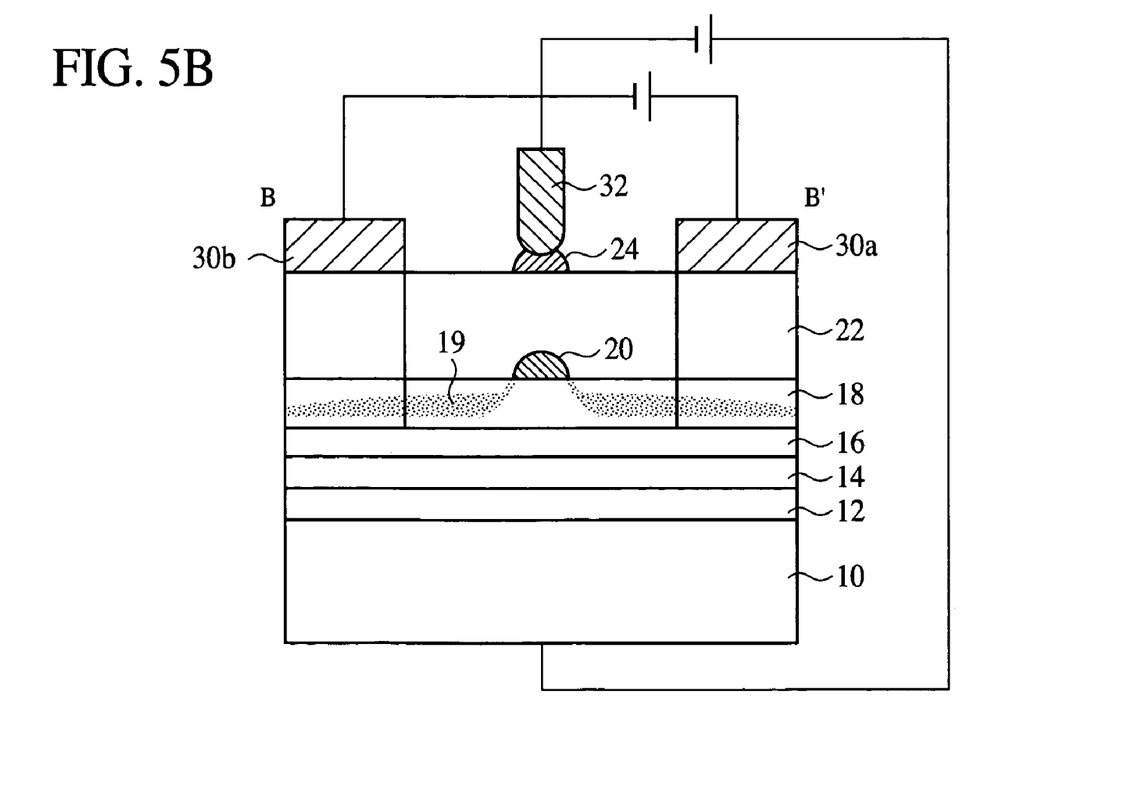

The n-type AlGaAs layer 14, the non-doped AlGaAs layer 16 and the non-doped GaAs layer 18 form a modulation doped structure for forming two-dimensional electron gas (2DEG). In this modulation doped structure, two-dimensional electron gas 19 (see FIG. 5) is formed in the GaAs layer 18. In the present embodiment, the n-type AlGaAs layer 14 is formed below, and the non-doped GaAS layer 18 is formed upper so that the distance between the quantum dot 20 and the two-dimensional electron gas 19 can be short. Preferably, the distance between the two-dimensional electron gas 19 and the quantum dot 20 is, e.g., below 5 nm. In FIG. 1, the two-dimensional electron gas 19 is omitted.

The structure that the non-doped GaAs layer 18 is formed on the n-type AlGaAs layer 14 with the non-doped AlGaAs layer 16 formed therebetween is exemplified here, but the structure for forming the two-dimensional electron gas 19 is not essentially this structure. For example, the n-type AlGaAs layer 14 may be formed on the non-doped GaAs layer 18 with the non-doped AlGaAs layer 16 formed therebetween. However, in order to make the distance between the quantum dot 20 and the two-dimensional electron gas 19, the structure described above is more advantageous.

The quantum dot 20 is formed on the non-doped GaAs layer 18. The quantum dot 20 is a three-dimensionally grown island self-assembled by S-K mode. The quantum dot 20 is formed of a material whose lattice constant is different from that of the GaAs layer 18. The material can be, e.g., InAs, InGaAs, InAlAs or others. The quantum dot 20 is formed in a size of, e.g., below 30 nm. As described above, to form discrete energy levels in the quantum dot it is preferable to make the quantum dot small. A semiconductor layer 22, specifically a non-doped GaAs layer is formed on the non-doped GaAs layer 18, covering the quantum dot 20. The thickness of the semiconductor layer 22 is, e.g., below 5-15 nm. The presence of the quantum dot 20 covered by the semiconductor layer 22 has caused crystal strains in the semiconductor layer 22.

The semiconductor layer 22 is formed here as thin as about 5-15 nm. The semiconductor layer 22 may be formed thick. The semiconductor layer 22 formed thick can prohibit the connection between the quantum dot 20 and the dot-shaped structure 24.

The dot-shaped structure 24 is formed on the surface of the semiconductor layer 22. The dot-shaped structure 24 is formed on the surface of the semiconductor layer 22 at the position which is accurately above the quantum dot 20. The dot-shaped structure 24 is formed as a three-dimensionally grown island self-assembled by S-K (Stranski-Krastanow) mode.

S-K mode is a mode that epitaxial semiconductor crystals grow two-dimensionally (into a film) at the start of the growth but, when the film has exceeded the elastic limit, grow three-dimensionally. A film whose lattice constant is different from that of a material below is epitaxially grown to be self-assembled quantum dots, i.e., three-dimensional island. S-K mode can easily fabricate quantum dots and is widely used in the fields of optoelectronic devices, etc.

The dot-shaped structure 24 is formed on the surface of the semiconductor layer 22 at the position which is accurately above the quantum dot 20, because the dot-shaped structure 24 tends to be self-assembled at a location, where crystal strains have taken place. The dot-shaped structure 24 can be a quantum dot or an anti-dot.

The dot-shaped structure 24 is formed of a material whose lattice constant is different from that of the semiconductor layer 22. The material of the dot-shaped structure 24 is, e.g., InAlAs. InAlAs is used as the material of the dot-shaped structure 24 in the present embodiment, because the dot-shaped structure 24 of InAlAs functions as a barrier to the electrons and does not electrically affect the quantum dot 20.

In the present embodiment, the dot-shaped structure 24 is formed of InAlAs, but the material of the dot-shaped structure 24 is not limited to InAlAs. The material of the dot-shaped structure 24 can be, e.g., InAs, InGaAs or others. The material of the dot-shaped structure 24 can even be a metal.

As shown in FIG. 1, an oxide layer 26a, 26b is formed on the surface of the semiconductor layer 22 on both sides of the dot-shaped structure 24. The thickness of the oxide layers 26a, 26b is as large as, e.g., about 5 nm. The oxide layer 26a, 26b is formed in such thickness so as to form depletion regions 28a, 28b in regions of the GaAs layer 18, which are below the oxide layer 26a, 26b and define a channel region 29.

Figure 3:
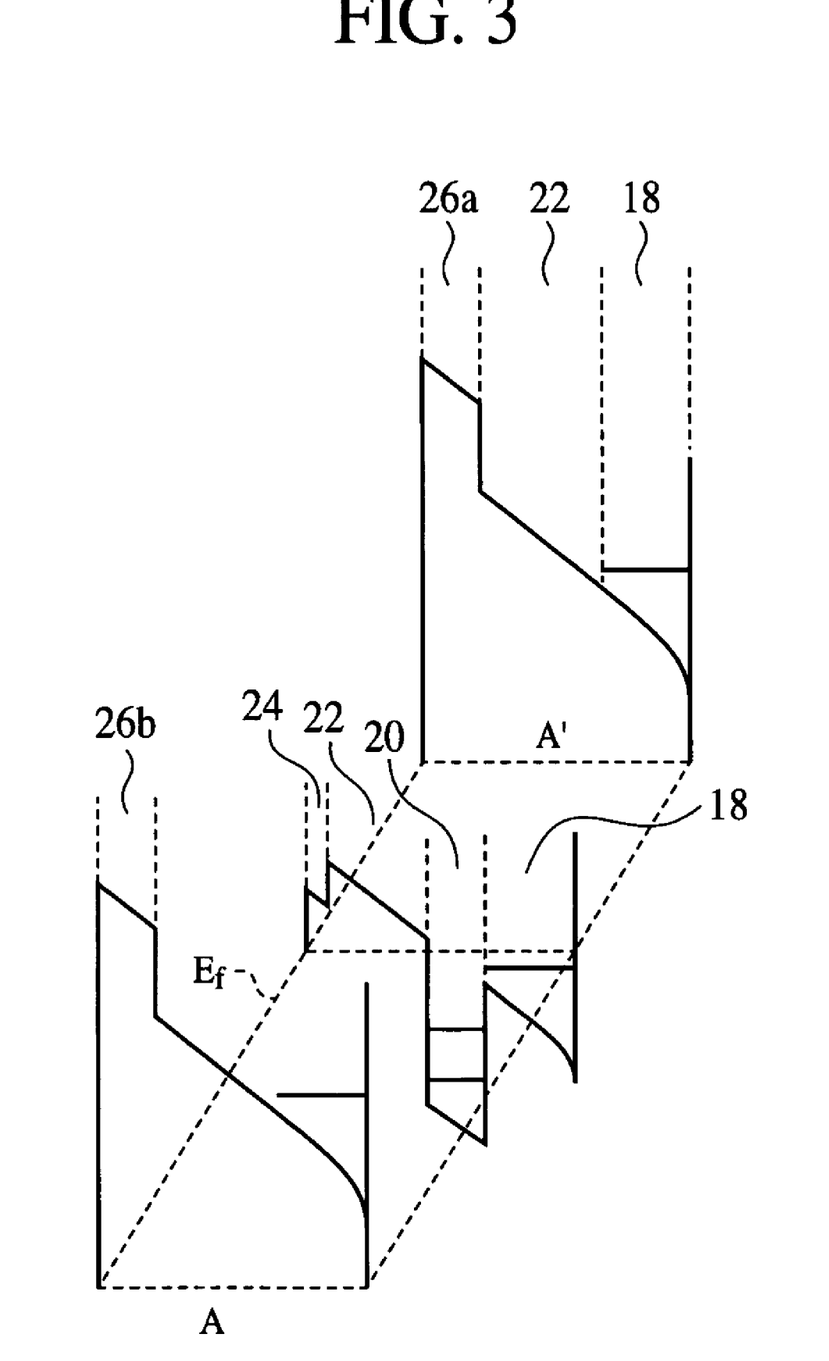
FIG. 3 is a view of an energy band structure of the quantum semiconductor device according to the embodiment of the present invention (Part 1).

FIG. 3 is a view (Part 1) of an energy band structure of the quantum semiconductor device according to the present embodiment.

As seen in FIG. 3, the regions of the GaAs layer 18, which are below the oxide layer 26a, 26b are depleted.

Non-Patent Reference 1 describes that with the oxide layer 26a, 26b formed thick, the depletion regions 28a, 28b are formed below the oxide layer 26a, 26b.

Source/drain regions 30a, 30b are formed in the semiconductor layer 22 from the surface of the semiconductor layer 22 down to the GaAs layer 18. The source/drain regions 30a, 30b are formed in contact with the channel region 29 defined by the depletion regions 28a, 28b.

A gate electrode 32 is formed on the dot-shaped structure 24.

Thus, the quantum semiconductor device according to the present embodiment is constituted.

Figure 4A:
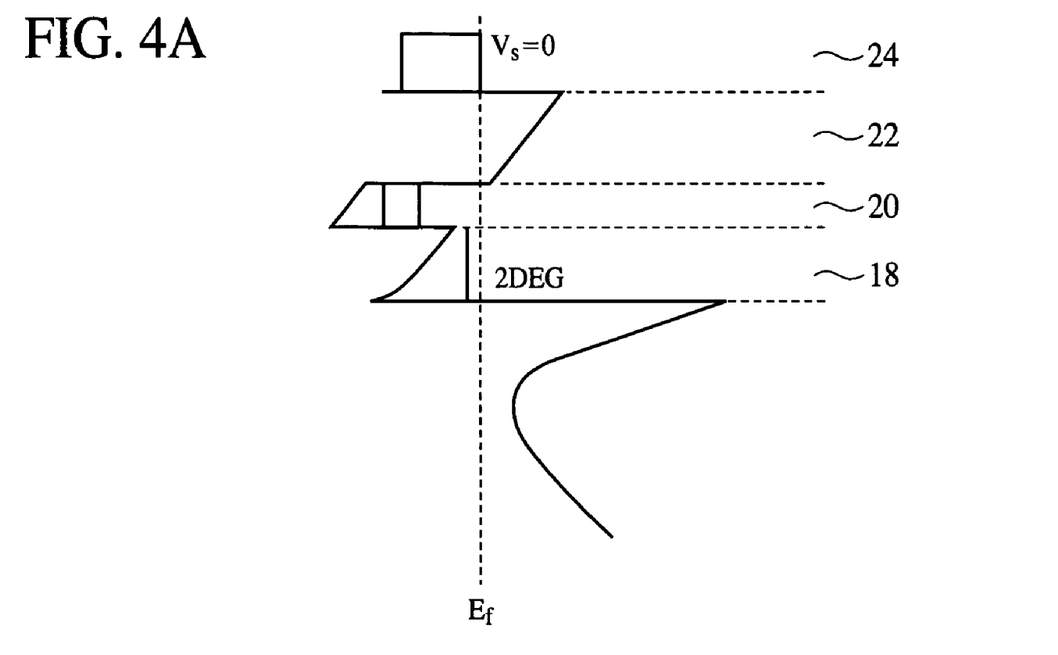
FIGS. 4A and 4B are views of energy band structures of the quantum semiconductor device according to the embodiment of the present invention (Part 2).
Figure 4B:
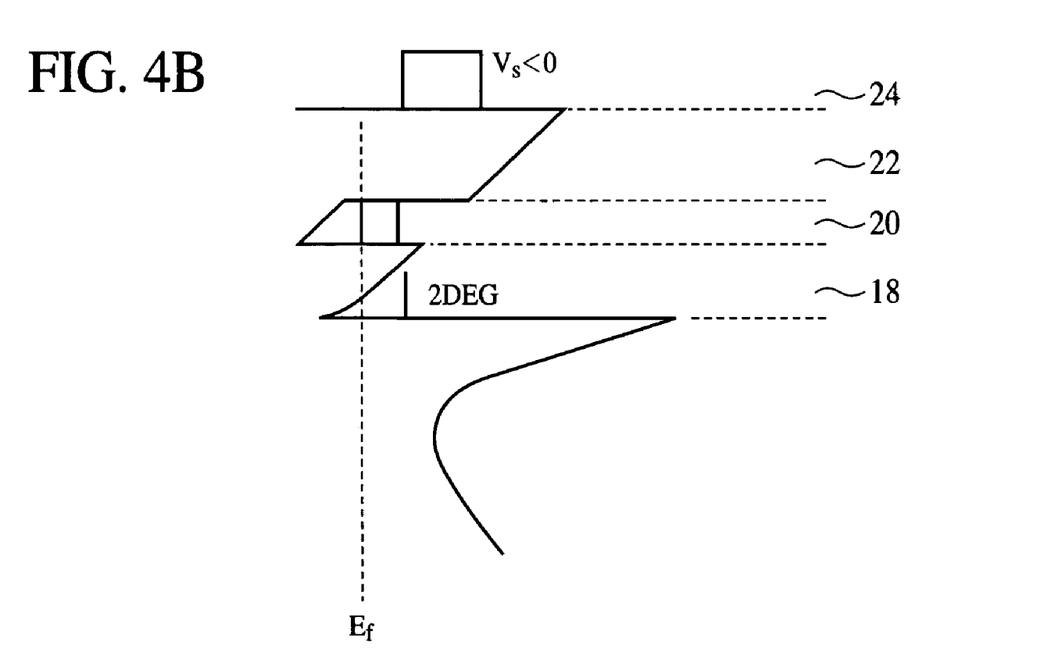

Next, the operation of the quantum semiconductor device according to the present embodiment will be explained with reference to FIGS. 4A to 5. FIGS. 4A and 4B are views of energy band structures of the quantum semiconductor device according to the present embodiment (Part 2). FIG. 4A shows the energy band structure without a voltage applied to the gate electrode. FIG. 4B shows the energy band structure with a voltage applied to the gate electrode. FIGS. 5A and 5B are conceptual views of the operation of the quantum semiconductor device according to the present embodiment. FIGS. 5A and 5B show the sectional view along the line B-B'. FIG. 5A shows the operation without a voltage applied to the gate electrode. FIG. 5B shows the operation with a negative voltage applied to the gate electrode.

Without a voltage applied to the gate electrode 32, the energy band structure is as shown in FIG. 4A. Accordingly, as shown in FIG. 5A, the electron transport in the two-dimensional electron gas 19 is never blockaded.

On the other hand, with a voltage applied to the gate electrode 32, the energy band structure is as shown in FIG. 4B. That is, the Fermi level $E_f$ is sufficiently lower than the ground state of the two-dimensional electron gas to decrease the carriers of the two-dimensional electron gas 19. Accordingly, as shown in FIG. 5B, the electron transport in the two-dimensional electron gas 19 is blockaded. However, as shown in FIG. 4B, the voltage to be applied to the gate electrode 32 is suitably set to make the quantization level and the Fermi level $E_f$ equal to each other, whereby the electrons can tunnel via the quantum dot 20. The voltage applied to the gate electrode 32 is suitably set to thereby control the transport of electrons.

In the present embodiment, the quantum dot 20 is so fine that discrete energy levels can be formed in the quantum dot 20. Accordingly, a double barrier structure can be formed in the quantum dot 20. Thus, the quantum semiconductor device according to the present embodiment is normally operative even at relative high temperatures.

The quantum semiconductor device according to the present embodiment is characterized mainly in that the dot-shaped structure 32 is formed on the surface of the semiconductor layer 22 at the position which is above the quantum dot 20, and the oxide layer 26a, 26b is formed with the dot-shaped structure 32 as a mark.

Generally, after a quantum dot has been formed, buried in a semiconductor layer, it is very difficult to accurately detect the position of the quantum dot buried in the semiconductor layer.

In contrast to this, in the present embodiment, the dot-shaped structure 24 is formed on the surface of the semiconductor layer 22 at the position accurately above the quantum dot 20, which results from the crystal strains generated in the semiconductor layer 22 due to the presence of the quantum dot 20. With the dot-shaped structure 24 as a mark, the oxide layer 26a, 26b can be formed. With the oxide layer 26a, 26b as a mark, the source/drain regions 30a, 30b can be formed. Thus, according to the present embodiment, even in a case that the fine quantum dot 20 self-formed is buried in the semiconductor layer 22, the quantum semiconductor device can be formed without failure.

According to the present embodiment, the self-formed quantum dot 20 is so fine that discrete energy levels can be provided in the quantum dot 20. The quantum semiconductor device according to the present embodiment is operative at relatively high temperatures.

(The Method for Fabricating the Quantum Semiconductor Device)

Then, the method for fabricating the quantum semiconductor device according to the present embodiment will be explained with reference to FIGS. 6A to 8B. FIGS. 6A to 8B are sectional views of the quantum semiconductor device according to the present embodiment in the steps of the method for fabricating the quantum semiconductor device. FIGS. 6A to 7B show the sectional view along the line A-A' in FIG. 2B. FIGS. 8A and 8B show the sectional view along the line B-B' in FIG. 2B.

Figure 6A:
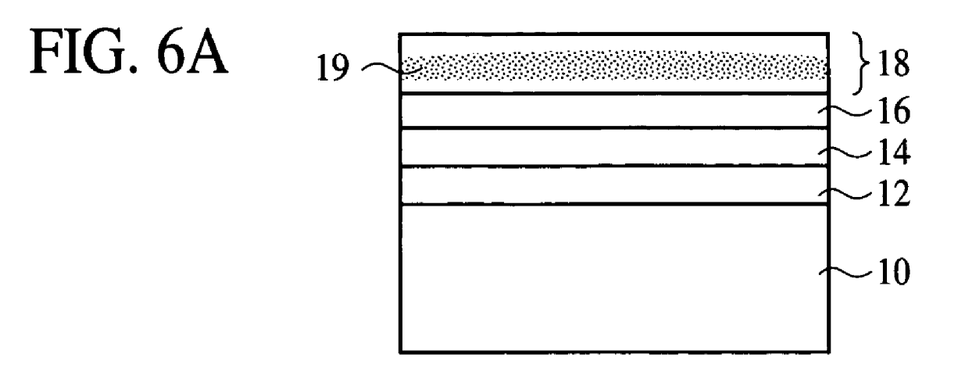
FIGS. 6A and 6B are sectional views of the quantum semiconductor device according to the embodiment of the present invention in the steps of the method for fabricating the quantum semiconductor device, which explain the method (Part 1).

First, as shown in FIG. 6A, the non-doped AlGaAs layer 12 is formed on the substrate 10 by, e.g., MBE, MOCVD or others. The substrate 10 is a semi-insulating substrate of, e.g., GaAs. The thickness of the non-doped AlGaAs layer 12 is, e.g., 200 nm.

Next, the n-type AlGaAs layer 14 is formed on the non-doped AlGaAs layer 12 by, e.g., MBE, MOCVD or others. The thickness of the n-type AlGaAs layer 14 is, e.g., about 10-20 nm.

Next, the non-doped AlGaAs layer 16 is formed on the n-type AlGaAs layer 14 by, e.g., MBE, MOCVD or others. The thickness of the non-doped AlGaAs layer 16 is, e.g., about 5-10 nm.

Next, the semiconductor layer, i.e., the non-doped GaAs layer 18 is formed on the non-doped AlGaAs layer 16 by, e.g., MBE, MOCVD or others. The thickness of the GaAs layer 18 is e.g., about 5 nm.

Thus, the n-type AlGaAs layer 14, the non-doped AlGaAs layer 16 and the non-doped GaAs layer 18 constitute the modulation doped layer for forming the two-dimensional electron gas (2DEG) In such modulation doped structure, the two-dimensional electron gas is formed in the GaAs layer 18. The carrier density of the two-dimensional gas 19 in the GaAs layer 18 is set at, e.g., about $1\times10^{11}$ cm$^{-2}$. The carrier density of the two-dimensional electron gas 19 is set such relatively low, so that when a voltage is applied to the gate electrode 32, the channel region 29 below the gate electrode 32 can be easily depleted. The carrier density of the two-dimensional electron gas 19 can be suitably set by suitably setting the thickness of the n-type AlGaAs layer 14, the non-doped AlGaAs layer 16 and the non-doped GaAs layer 18 and the concentration of the dopant impurity.

Figure 6B:
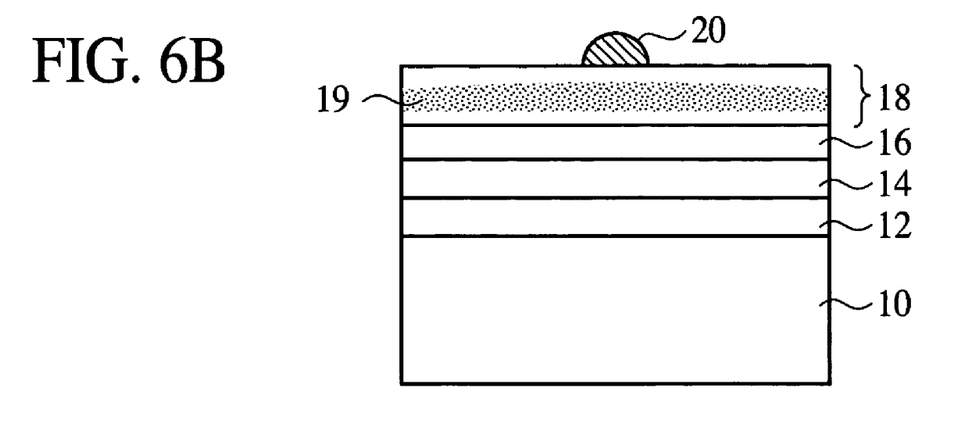

Next, as shown in FIG. 6B, the quantum dot 20 is formed by, e.g., MBE, MOCVD or others. The quantum dot 20 is formed of a material whose lattice constant is different from that of the lower GaAs layer 18. The material of the quantum dot 20 can be, e.g., InAs, InGaAs, InAlAs or others. The lattice mismatching between the upper material and the lower GaAs layer 18 makes the upper layer evolve into a three-dimensional island in S-K mode. The density of the quantum dot 20 is, e.g., about $1\times10^9$ cm$^{-2}$.

Figure 7A:
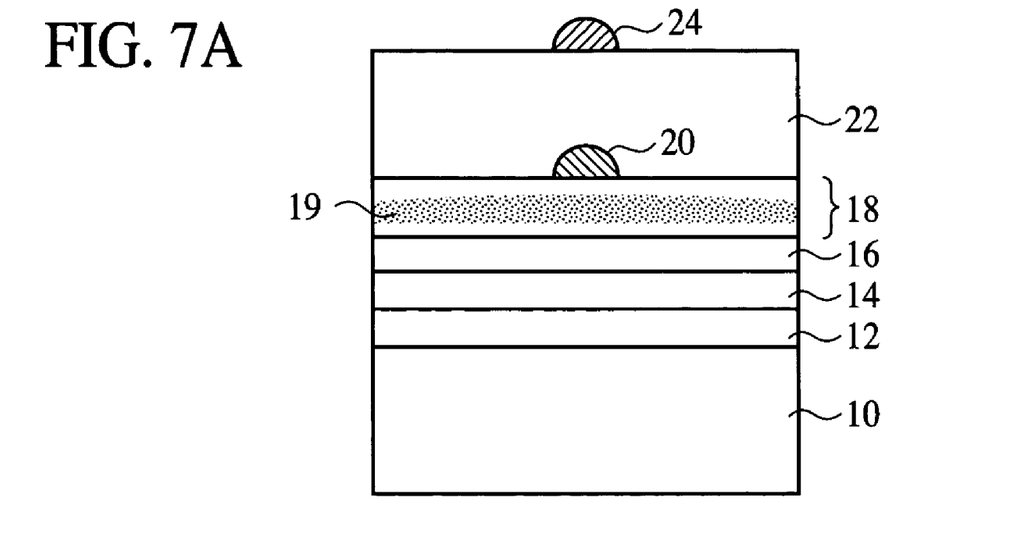
FIGS. 7A and 7B are sectional views of the quantum semiconductor device according to the embodiment of the present invention in the steps of the method for fabricating the quantum semiconductor device, which explain the method (Part 2).
Figure 8A:
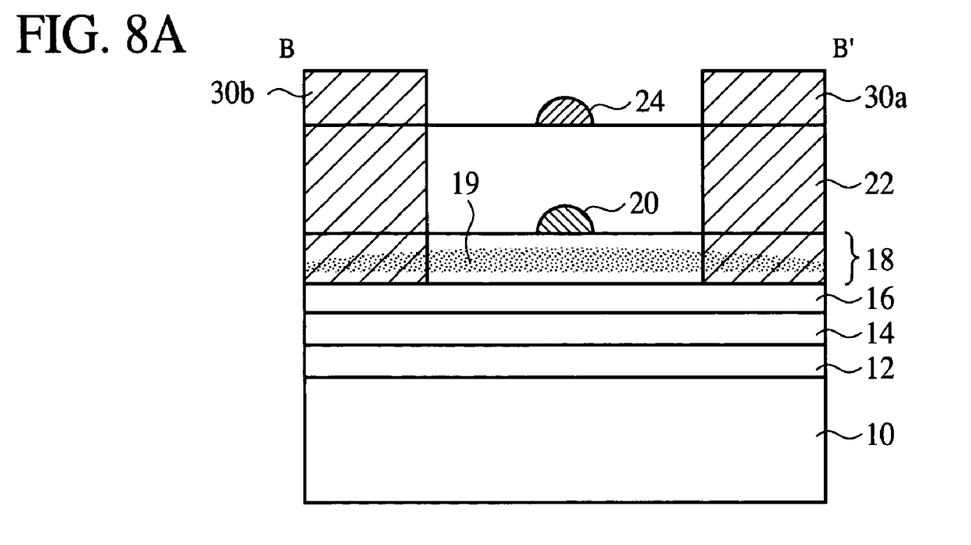
FIGS. 8A and 8B are sectional views of the quantum semiconductor device according to the embodiment of the present invention in the steps of the method for fabricating the quantum semiconductor device, which explain the method (Part 3).
Figure 8B:
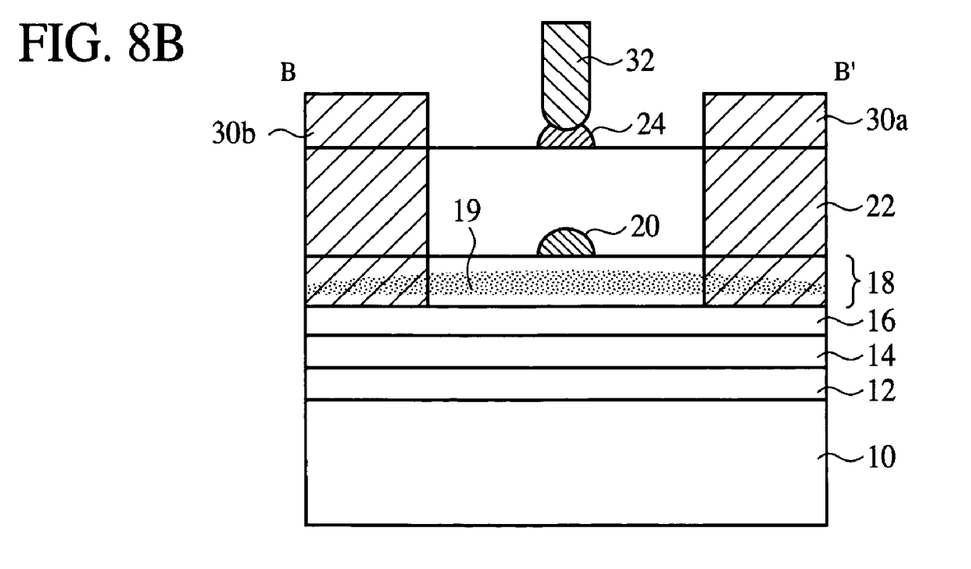

Then, as shown in FIG. 7A, the semiconductor layer, i.e., the GaAs layer 22 is formed by, e.g., MBE, MOCVD or others, covering the quantum dot 20. The thickness of the GaAs layer 22 is, e.g., about 5-15 nm. The presence of the quantum dot 20 causes crystal strains in the semiconductor layer 22 at the location exactly above the quantum dot 20.

Next, the dot-shaped structure 24 is f formed by, e.g., MBE, MOCVD or others. The dot-shaped structure 24 is formed of a material whose lattice constant is different from that of the below GaAs layer 22. The material of the dot-shaped structure 24 can be, e.g., InAlAs. The dot-shaped structure 24 tends to be self-assembled at a location on the GaAs layer 22 where crystal strains are generated. Accordingly, the dot-shaped structure 24 is formed at the position of the surface of the GaAs layer 22, which is accurately above the quantum dot 20. The dot-shaped structure 24, which is formed accurately above the quantum dot 20, can be a mark for identifying the region for the oxide layer 26a, 26b to be formed in a later step.

Figure 7B:
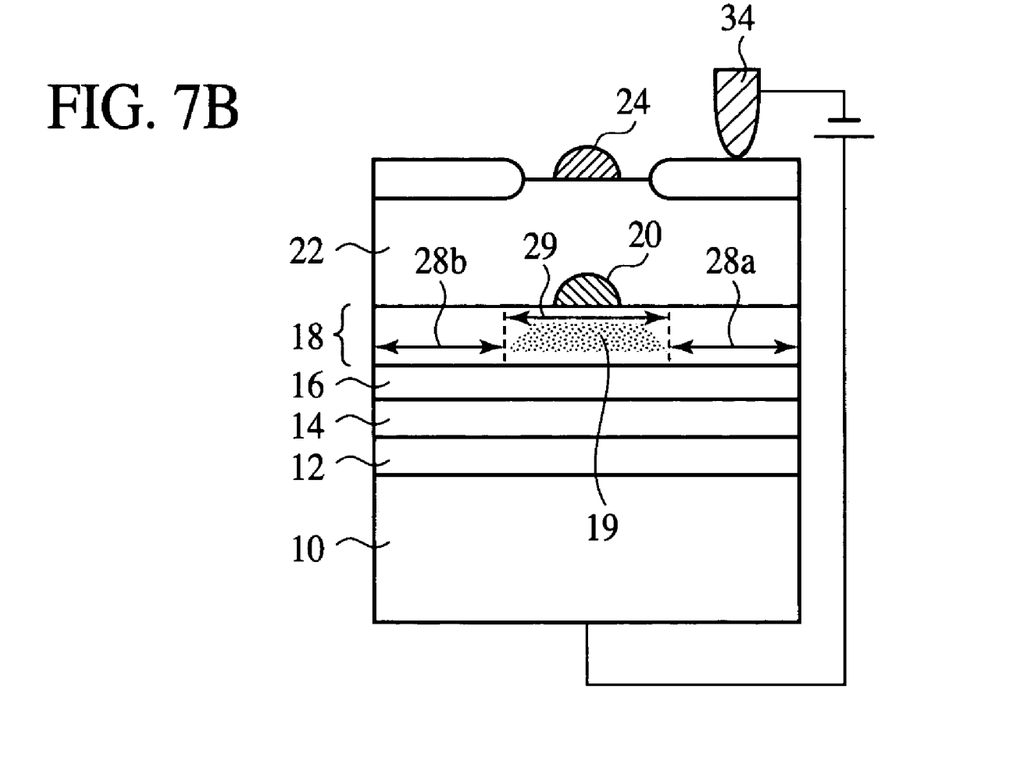

Then, as shown in FIG. 7B, the oxide layer 26a, 26b is formed on the surface of the GaAs layer 22 on both sides of the dot-shaped structure 24 with the dot-shaped structure 24 as a mark. The thickness of the oxide layer 26a, 26b is, e.g., 5 nm. The oxide layer 26a, 26b can be formed, e.g., by causing the probe 34 of an atomic force microscope to scan the surface of the GaAs layer 22 very near the surface with a voltage being applied between the probe 32 and the substrate 10. The oxide layer 26a, 26b is formed thick to thereby form the depletion regions 28a, 28b in the regions of the GaAs layer 18, which are below the oxide layer 26a, 26b. Because of the quantum dot 20 buried below the dot-shaped structure 24 to be the mark, the depletion regions 28a, 28b are positioned accurately on both sides of the quantum dot 20. The depletion region 28a, 28b defines the channel region 29. The quantum dot 20 can position above the channel region 29.

Next, as shown in FIG. 8A, as the oxide layer 26a, 26b as a mark, the source/drain regions 30a, 30b are formed on both sides of the channel region 29 in contact with the channel region 29. The source/drain regions 30a, 30b can be formed by depositing a metal film in these regions and diffusing the metal by thermal processing.

The width of the oxide layer 26a, 26b is relatively large, about hundreds nanometers, and the pattern of the oxide layer 26a, 26b can be recognized even with the generally used photolithography system or an electron beam exposure system. The width of the source/drain regions 30a, 30b is relatively large, hundreds nanometers, which permits the mask pattern for forming the source/drain regions 30a, 30b to be aligned with the oxide layer 26a, 26b as a mark, and the source/drain regions 30a, 30b can be formed at suitable positions by lithography.

Next, as shown in FIG. 8B, the gate electrode 32 is formed on the dot-shaped structure 24.

Thus, the quantum semiconductor device according to the present embodiment is fabricated.

(Modification 1)

Figure 9:
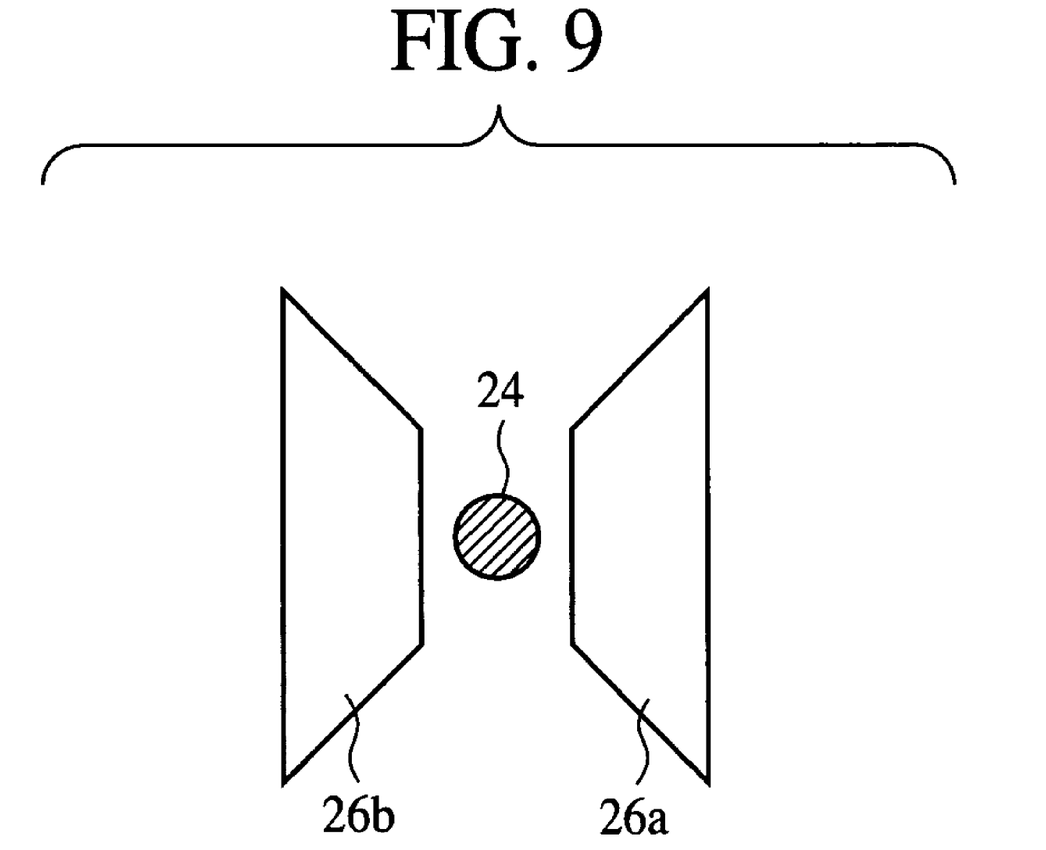
FIG. 9 is a plan view of the quantum semiconductor device according to Modification 1 of the embodiment of the present invention.

Then, the quantum semiconductor device according to Modification 1 of the above-described embodiment will be explained with reference to FIG. 9. FIG. 9 is a plan view of the quantum semiconductor device according to the present modification. In FIG. 9, the constituent members, such as the source/drain regions, etc., are omitted. The quantum semiconductor device according to the present modification is characterized mainly in that the distance between the oxide layer 26a, 26b is set larger. The distance between the oxide layer 26a and the oxide layer 26b is, e.g., 150 nm.

According to the present modification, the gap between the oxide layer 26a and the oxide layer 26b is large, and the gap between the depletion region 28a formed below the oxide layer 26a and the depletion region 28b formed below the oxide layer 26b can be large. According to the present modification, the deletion regions 28a, 28b can be kept from affecting the quantum dot 20.

(Modification 2)

Figure 10A:
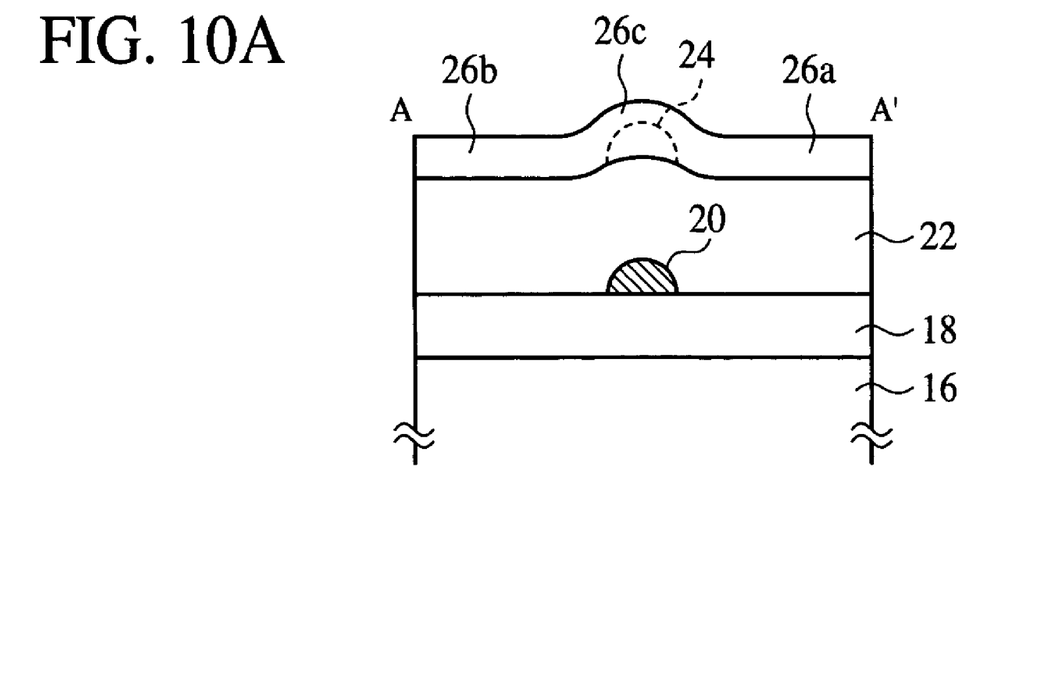
FIG. 10A is a sectional view of the quantum semiconductor device according to Modification 2 of the embodiment of the present invention.
Figure 10B:
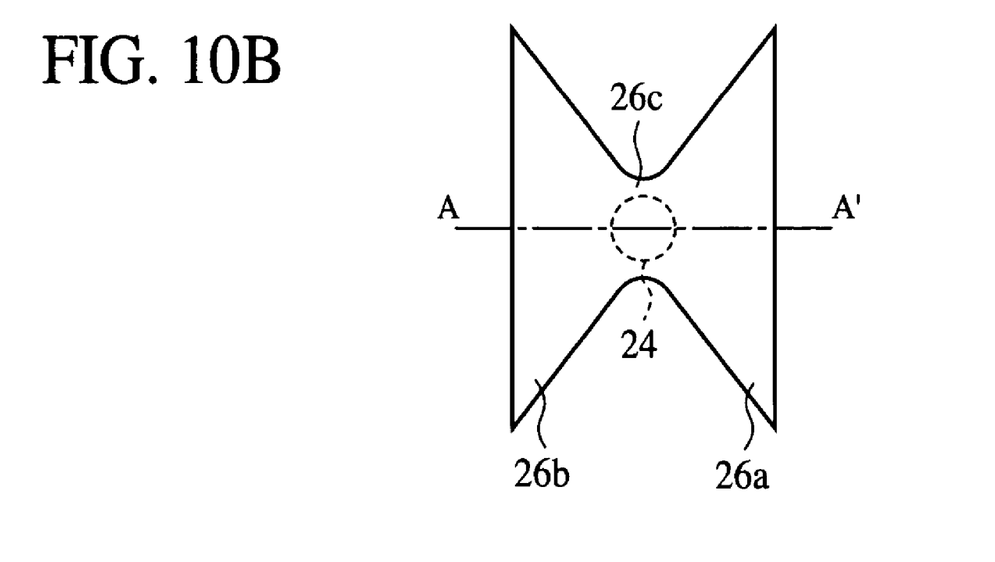
FIG. 10B is a plan view of the quantum semiconductor device according to Modification 2 of the embodiment of the present invention.

Then, the quantum semiconductor device according to Modification 2 of the above-described embodiment of the present invention will be explained with reference to FIGS. 10A and 10B. FIG. 10A is a sectional view of the quantum semiconductor device according to the present modification. FIG. 10B is a plan view of the quantum semiconductor device according to the present modification. FIG. 10A is the sectional view along the line A-A' in FIG. 10B.

The quantum semiconductor device according to the present modification is characterized mainly in that the dot-shaped structure 24 is oxidized.

As shown in FIG. 10, the dot-shaped structure 24 is oxidized, and the oxide layer 26c is formed on the surface of the semiconductor layer 22 at the position which is above the quantum dot 20. Because of the oxide layer 26c, which is formed above the quantum dot 20, even a vicinity of the quantum dot 20 is depleted under the influence of the oxide layer 26c.

The dot-shaped structure 24 may be thus oxidized.

(Modification 3)

Figure 11A:
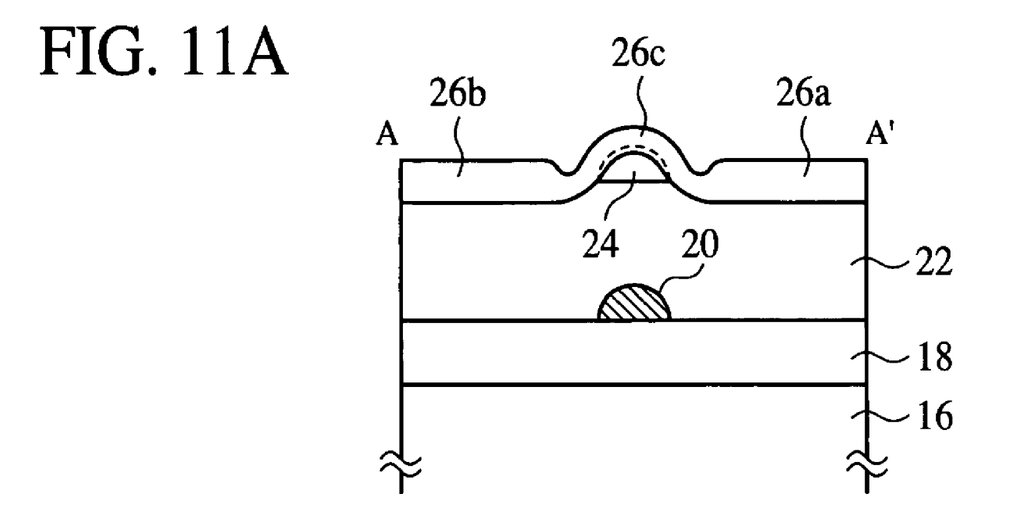
FIG. 11A is a sectional view of the quantum semiconductor device according to Modification 3 of the embodiment of the present invention.
Figure 11B:
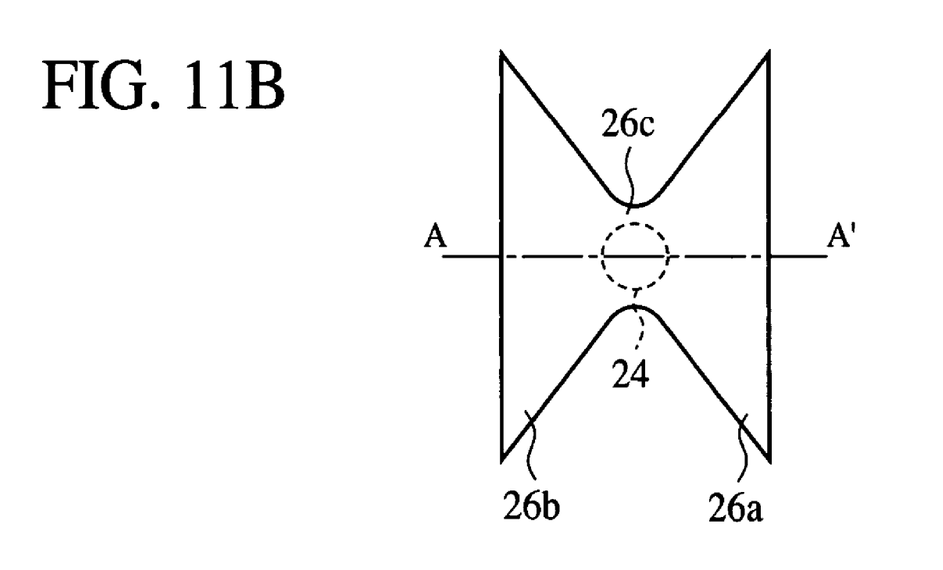
FIG. 11B is a plan view of the quantum semiconductor device according to Modification 3 of the embodiment of the present invention.

Then, the quantum semiconductor device according to Modification 3 of the above-described embodiment of the present invention will be explained with reference to FIGS. 11A and 11B. FIG. 11A is a sectional view of the quantum semiconductor device according to the present modification. FIG. 11B is a plan view of the quantum semiconductor device according to the present modification. FIG. 11A is the sectional view along the line A-A' in FIG. 11B.

The quantum semiconductor device according to the present modification is characterized mainly in that only a part of the dot-shaped structure 24 is oxidized.

As shown in FIGS. 11A and 11B, in the present modification, only a part of the dot-shaped structure 24, specifically the surface alone of the dot-shaped structure 24 is oxidized.

In the quantum semiconductor device described above with reference to FIGS. 10A and 10B, wherein the whole dot-shaped structure 24 is oxidized, the vicinity of the quantum dot 20 will be excessively depleted under the influence of the oxide layer 26c.

In contrast to this, in the present modification, wherein only a part of the dot-shaped structure 24 is oxidized, the excessive depletion of the vicinity of the quantum dot 20 under the influence of the oxide layer 26c can be prohibited.

[Modified Embodiments]

The present invention is not limited to the above-described embodiment and can cover other various modification.

For example, in the above-described embodiment, the present invention is explained by means of the quantum semiconductor device which is operative as a single electron transistor. However, the present invention is applicable not only to single electron transistors but also any quantum semiconductor device. The present invention is applicable to quantum semiconductor devices which operate, for example, as single electron memories, quantum computers, etc. That is, according to the present invention, the dot-shaped structure 24 is formed on the surface of the semiconductor layer 22 at the position which is accurately above the quantum dot 20, and with the dot-shaped structure 24 as a mark, various constituent elements are formed, whereby any quantum semiconductor device can be fabricated.

In the above-described embodiment, the source/drain regions 30a, 30b are formed after the oxide layers 26a, 26b have been formed, but the oxide layers 26a, 26b may be formed after the source/drain regions 30a, 30b have been formed.

In the above-described embodiment, the two-dimensional electron gas is formed as the two-dimensional carrier gas, but two-dimensional gas (2DHG) may be formed. The conduction re suitably set, whereby the formed.

What is claimed is:

1. A quantum semiconductor device comprising:
    a first semiconductor layer formed over a substrate and having a two-dimensional carrier gas formed in;
    a quantum dot formed over the first semiconductor layer;
    a second semiconductor layer formed over the first semiconductor layer, burying the quantum dot;
    a dot-shaped structure formed on the surface of the second semiconductor layer at a position above the quantum dot;
    a gate electrode electrically connected to the dot-shaped structure;
    source/drain regions formed in the second semiconductor layer on both sides of the quantum dot; and
    oxide layers formed on both sides of the dot-shaped structure on the upper surface of the second semiconductor layer,
    wherein depletion regions are formed in regions of the first semiconductor layer, which are below the oxide layers, the depletion regions define a channel region, and the source/drain regions are connected to both ends of the channel region, and
    the dot-shaped structure is caused to form on the surface of the second semiconductor layer at a position above the quantum dot due to crystal strains generated in the surface of the second semiconductor layer due to the presence of the quantum dot.

2. A quantum semiconductor device according to claim 1, wherein
    the quantum dot is in a three-dimensionally grown island self-assembled by S-K mode.

3. A quantum semiconductor device according to claim 1, wherein
    the dot-shaped structure is in a three-dimensionally grown island self-assembled by S-K mode.

4. A quantum semiconductor device according to claim 1, wherein
    a distance between the two-dimensional carrier gas and the quantum dot is 5 nm or less.

5. A quantum semiconductor device according to claim 1, wherein
    the dot-shaped structure is in another quantum dot or an anti-dot.

6. A quantum semiconductor device according to claim 1, wherein
    at least a part of the dot-shaped structure is oxidized.

7. A method for fabricating a quantum semiconductor device comprising the steps of:
    forming over a substrate a first semiconductor layer with a two-dimensional carrier gas formed in;
    forming a quantum dot over the first semiconductor layer;
    forming a second semiconductor layer, burying the quantum dot;
    forming a dot-shaped structure on the surface of the second semiconductor layer at a position above the quantum dot due to strains generated in the surface of the second semiconductor layer due to the presence of the quantum dot;
    forming oxide layers on the upper surface of the second semiconductor layer on both side of the dot-shaped structure with the dot-shaped structure as a mark to thereby form depletion regions in regions of the first semiconductor layer below the oxide layers, and define a channel region by the depletion regions;
    forming source/drain regions connected to both ends of the channel region in the second semiconductor layer; and
    forming a gate electrode electrically connected to the dot-shaped structure.

8. A method for fabricating a quantum semiconductor device according to claim 7, further comprising, after the step of forming the oxide layer, the step of forming source/drain regions with the oxide layer as a mark.

9. A method for fabricating a quantum semiconductor device according to claim 7, wherein in the step of forming the quantum dot, the quantum dot in a three-dimensional grown island is self-assembled by S-K mode.

10. A method for fabricating a quantum semiconductor device according to claim 7, wherein in the step of forming the dot-shaped structure, the dot-shaped structure in a three-dimensional grown island is self-assembled by S-K mode.

11. A method for fabricating a quantum semiconductor device according to claim 7, wherein in the step of forming an oxide layer, the oxide layer is formed by bringing a needle-shaped conductor close to the surface of the second semiconductor layer and applying a voltage between the needle-shaped conductor and the substrate.

12. A method for fabricating a quantum semiconductor device according to claim 11, wherein the needle-shaped conductor is a probe of an atomic force microscope.

* * * * *